(12) United States Patent
Izumi et al.

(10) Patent No.: US 10,738,389 B2
(45) Date of Patent: Aug. 11, 2020

(54) SEMICONDUCTOR MANUFACTURING APPARATUS

(71) Applicant: Toshiba Memory Corporation, Minato-ku (JP)

(72) Inventors: Takashi Izumi, Yokkaichi (JP); Fumitoshi Ikegaya, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 1097 days.

(21) Appl. No.: 14/847,374

(22) Filed: Sep. 8, 2015

(65) Prior Publication Data

US 2016/0362793 A1 Dec. 15, 2016

Related U.S. Application Data

(60) Provisional application No. 62/173,543, filed on Jun. 10, 2015.

(51) Int. Cl.
| | |
|---|---|
| *C25D 7/12* | (2006.01) |
| *C25D 3/38* | (2006.01) |
| *C25D 21/14* | (2006.01) |
| *C25D 21/18* | (2006.01) |
| *C25D 21/12* | (2006.01) |
| *H05K 3/42* | (2006.01) |
| *C25D 21/16* | (2006.01) |

(52) U.S. Cl.
CPC .............. *C25D 7/123* (2013.01); *C25D 3/38* (2013.01); *C25D 21/12* (2013.01); *C25D 21/14* (2013.01); *C25D 21/16* (2013.01); *C25D 21/18* (2013.01); *H05K 3/424* (2013.01)

(58) Field of Classification Search
CPC ............ C23C 18/1617; C23C 18/1683; C23C 18/1628; C25D 7/123; C25D 3/38; C25D 21/12; C25D 21/14; C25D 21/16; C25D 21/18; H05K 3/424
See application file for complete search history.

(56) References Cited

U.S. PATENT DOCUMENTS

| | | | | |
|---|---|---|---|---|
| 6,471,845 | B1 * | 10/2002 | Dukovic | C25D 21/12 137/93 |
| 7,988,842 | B2 | 8/2011 | Tachibana et al. | |
| 2004/0055888 | A1 * | 3/2004 | Wikiel | C23C 18/1683 205/81 |
| 2004/0217005 | A1 * | 11/2004 | Rosenfeld | A23D 7/00 205/82 |
| 2009/0026083 | A1 | 1/2009 | Tachibana et al. | |

FOREIGN PATENT DOCUMENTS

| | | |
|---|---|---|
| JP | 2009-293083 | 12/2009 |
| JP | 4957906 | 6/2012 |
| JP | 5420208 | 2/2014 |

* cited by examiner

*Primary Examiner* — Katherine A Bareford
(74) *Attorney, Agent, or Firm* — Oblon, McClelland, Maier & Neustadt, L.L.P.

(57) ABSTRACT

A semiconductor manufacturing apparatus according to an embodiment comprises a container contains a mixed solution that includes a processing solution for plating processing of a substrate and an additive and being capable of draining a part of the mixed solution when a first condition is satisfied. A first supplier supplies the processing solution to the container. A second supplier supplies the additive to the container when the first condition is satisfied and drainage of a part of the mixed solution is finished.

2 Claims, 7 Drawing Sheets

SEMICONDUCTOR MANUFACTURING APPARATUS

CROSS REFERENCE TO RELATED APPLICATIONS

This application is based upon and claims the benefit of priority from the prior U.S. Provisional Patent Application No. 62/173,543, filed on Jun. 10, 2015, the entire contents of which are incorporated herein by reference.

FIELD

The embodiments of the present invention relate to a semiconductor manufacturing apparatus.

BACKGROUND

A plating apparatus that performs plating processing of copper or the like sometimes adds an additive such as a promoter to a plating solution to provide uniform plating in a short time. For example, when copper serving as an interconnect material is embedded into spaces between fine patterns on a substrate as in a damascene method, additives such as an accelerator, a suppressor, and a leveler are added to a plating solution to grow copper in the spaces between the patterns in a short time while suppressing voids from occurring in interconnections. These additives are added to the plating solution when the concentrations thereof in the plating solution become lower than a predetermined value or periodically.

However, because the additives are decomposed into matters that hamper the plating processing as the time passes, bleed and feed (hereinafter, also "BF process") needs to be performed when the amount of the plating solution has reached a predetermined level or periodically. The BF process of the plating solution is performed independently of addition of the additives and the BF process of the plating solution may be performed when the concentrations of the additives are high. In this case, the additives are drained wastefully by the BF process of the plating solution.

DETAILED DESCRIPTION

Embodiments will now be explained with reference to the accompanying drawings. The present invention is not limited to the embodiments.

A semiconductor manufacturing apparatus according to an embodiment comprises a container contains a mixed solution that includes a processing solution for plating processing of a substrate and an additive and being capable of draining a part of the mixed solution when a first condition is satisfied. A first supplier supplies the processing solution to the container. A second supplier supplies the additive to the container when the first condition is satisfied and drainage of a part of the mixed solution is finished.

Figure 1:
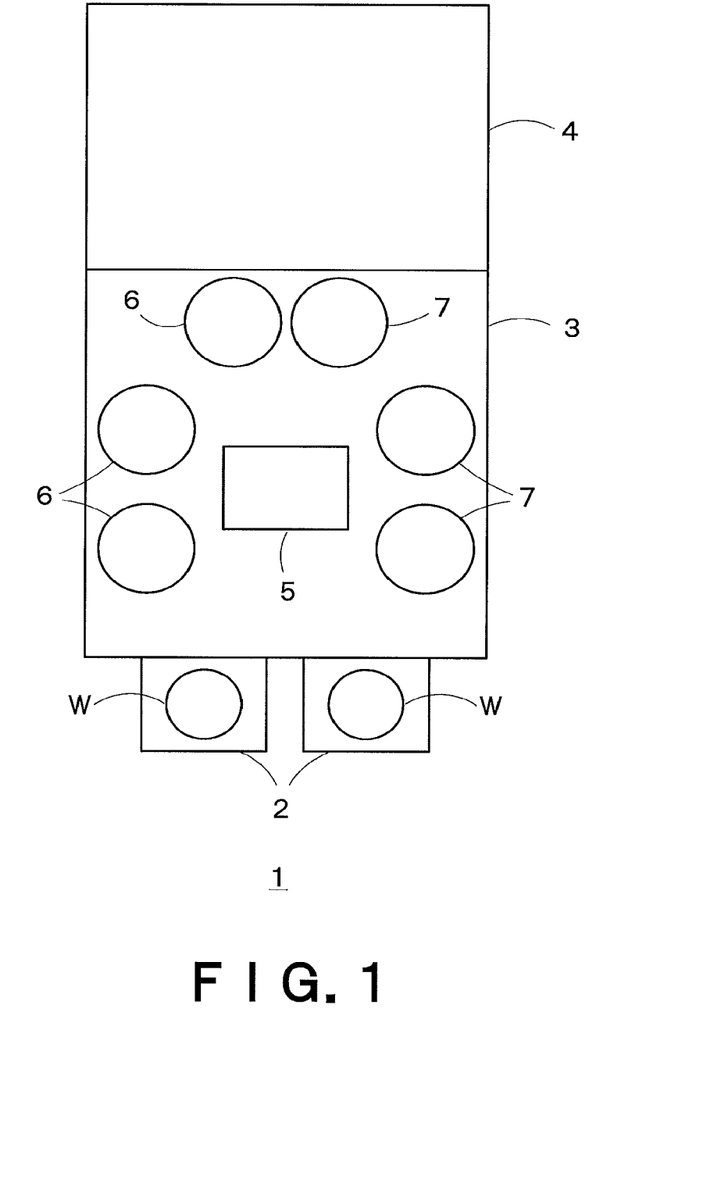
FIG. 1 is a schematic diagram showing an example of a configuration of a plating apparatus 1 according to an embodiment.

FIG. 1 is a schematic diagram showing an example of a configuration of a plating apparatus 1 according to an embodiment. The plating apparatus 1 includes a load port 2, a processor 3, and a plating solution holder 4. A substrate holder in which semiconductor substrates W are held can be attached to or detached from the load port 2, which enables the semiconductor substrates W to be transported between the substrate holder and the processor 3.

The processor 3 includes a transport robot 5, plating cells 6, and a water washer 7. The transport robot 5 transports the semiconductor substrates W from the load port 2 to the plating cells 6 when the semiconductor substrates W are to be subjected to plating processing, or transports the semiconductor substrates W from the plating cells 6 to the water washer 7 and further from the water washer 7 to the load port 2 after the plating processing is performed. The plating cells 6 hold the semiconductor substrates W therein and expose the surfaces of the semiconductor substrates W to the plating solution to perform the plating processing, respectively. The plating solution circulates between the plating cells 6 and the plating solution holder 4. The water washer 7 is provided to rinse the plating solution off the semiconductor substrates W after the plating processing of the semiconductor substrates W is performed.

The plating solution holder 4 holds therein the plating solution and supplies the plating solution to the plating cells 6 or recovers the plating solution used in the plating cells 6.

Figure 2:
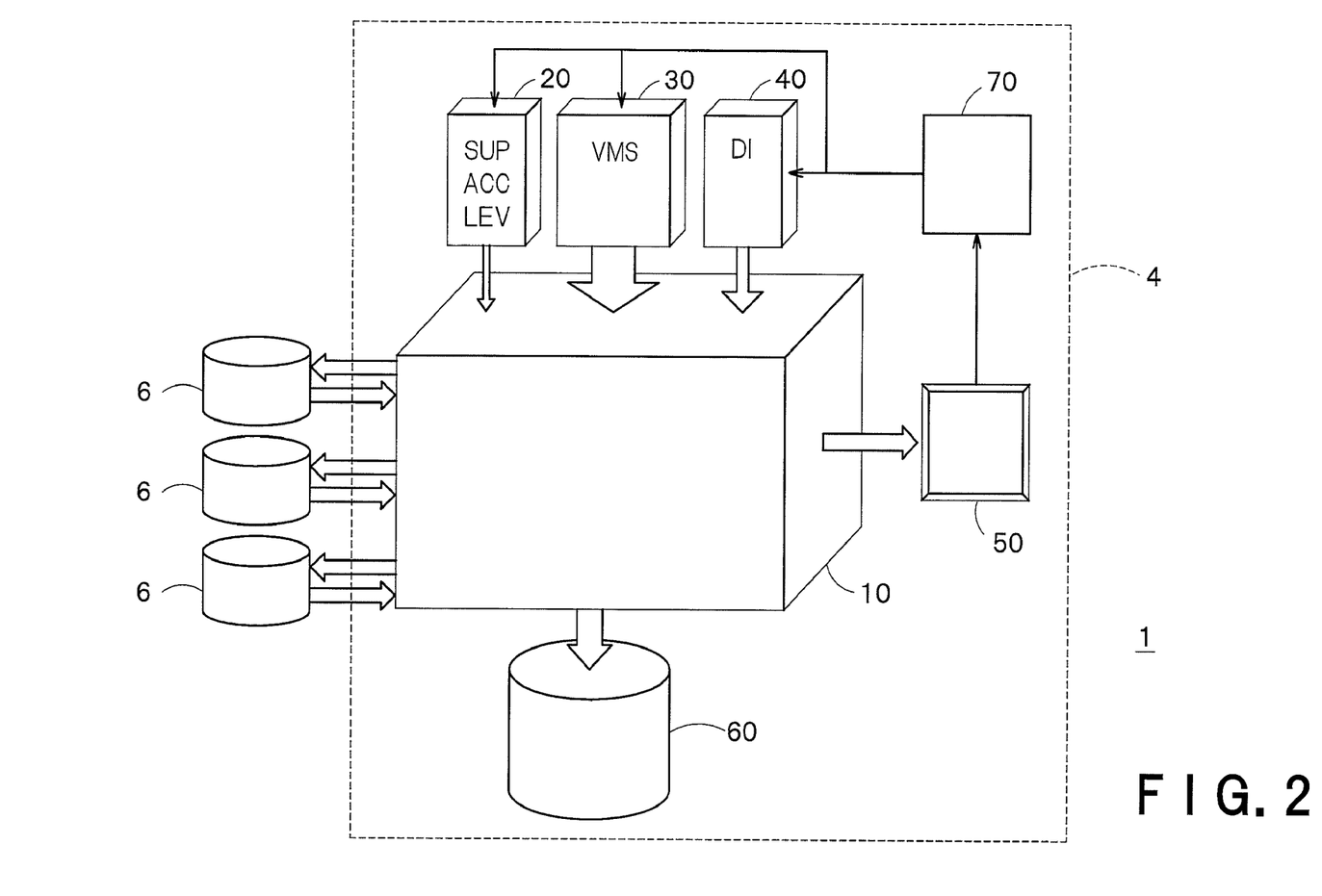
FIG. 2 is a schematic diagram showing an example of an internal configuration of the plating solution holder 4 according to the present embodiment.

FIG. 2 is a schematic diagram showing an example of an internal configuration of the plating solution holder 4 according to the present embodiment. The plating solution holder 4 includes a plating solution bath 10, an additive supplier 20, a plating solution supplier 30, a deionized water supplier 40, a concentration analyzer 50, a drained solution tank 60, and a computing controller 70.

The plating solution bath 10 serving as a container holds therein the plating solution and additives for performing the plating processing of the semiconductor substrates W. For example, the plating solution bath 10 has the plating solution of about 100 liters or more accumulated therein. The plating solution in the plating solution bath 10 has the additives added to. The plating solution having the additives added thereto is hereinafter referred to also as "mixed solution". The additives are explained later.

As described above, the plating solution bath 1 supplies the mixed solution to the plating cells 6 and recovers the mixed solution used in the plating cells 6, thereby circulating the mixed solution. For example, when the semiconductor substrates W are to be plated with copper, a copper sulfate plating solution (also "VMS (Virgin Make-up Solution)" is used as the plating solution.

The additives are decomposed by being used in the plating processing or as the time passes, and adversely interfere with the plating processing. Therefore, the plating solution bath 10 is configured to drain a part of the mixed solution to the drained solution tank 60 periodically or when a first condition explained later is satisfied. The plating solution supplier 30 supplies a new plating solution to the plating solution bath 10 and the additive supplier 20 supplies the additives to the plating solution bath 10. Accordingly, the mixed solution in the plating solution bath 10 is replaced with a new mixed solution partially little by little.

The plating solution supplier 30 serving as a first supplier periodically supplies (feeds) the plating solution (the copper sulfate plating solution (VMS)) having no additives added thereto to the plating solution bath 10. In the present embodiment, the plating solution supplier 30 supplies the copper sulfate plating solution to plate the semiconductor substrates W with copper. However, when the semiconductor substrates W are to be plated with another metal, the plating solution supplier 30 can supply another plating solution. In this case, it suffices to change also the type of a mixed solution in the plating solution bath 10 according to metal with which the semiconductor substrates W are plated.

The additive supplier 20 serving as a second supplier supplies the additives, which are to be added to the plating solution, to the plating solution bath 10. The additive supplier 20 supplies predetermined amounts (10 milliliters, for example) of the additives to the plating solution bath 10 when the concentrations of the additives have fallen below a predetermined value or when a predetermined time has passed.

The additives are, for example, an accelerator (ACC), a suppressor (SUP), and a leveler (LEV). The accelerator is an additive that accelerates the plating processing and can be, for example, an organic thio compound. The suppressor is an additive that suppresses accumulation of copper at opening ends of concave-convex patterns on the semiconductor substrates W and that suppresses occurrence of voids in spaces. The suppressor is, for example, a polymer surfactant. The leveler is an additive that suppresses bias in growth of copper due to sparse and dense patterns on the semiconductor substrates W to cause copper to grow substantially uniformly. The leveler is, for example, a nitrogen-containing organic compound. By adding these additives to the plating solution, copper can be embedded into spaces between fine patterns on the semiconductor substrates W substantially uniformly in a short time.

The deionized water supplier 40 supplies (feeds) DI (Deionized Water) to the plating solution bath 10. Water evaporates from the mixed solution in the plating solution bath 10 as the time passes. Evaporation of water changes the concentration of the plating solution or the concentrations of the additives in the mixed solution with time. The deionized water supplier 40 thus feeds the DI periodically. This enables the concentration of the plating solution or the concentrations of the additives in the mixed solution to be maintained.

The concentration analyzer (CMS (Chemical Monitoring System) 50 serving as a measuring part measures the concentrations of the additives in the mixed solution in the plating solution bath 10 periodically (once per day, for example). In the present embodiment, while being accurate, the concentration measurement values of the additives are measured by the concentration analyzer 50 at a low frequency and cannot be fed back in real-time. Therefore, the concentration measurement values are not used as a condition (the first condition) for supplying the plating solution and the additives.

The computing controller 70 controls the additive supplier 20, the plating solution supplier 30, and the deionized water supplier 40 based on the concentrations of the additives, the time, and the like. Accordingly, the additive supplier 20, the plating solution supplier 30, and the deionized water supplier 40 can automatically supply the additives, the plating solution, and the DI, respectively, to the plating solution bath 10. The additive supplier 20, the plating solution supplier 30, and the deionized water supplier 40 can supply the additives, the plating solution, and the DI at different timings, respectively. The additive supplier 20 can supply the accelerator, the suppressor, and the leveler at different timings, respectively.

The computing controller 70 calculates the concentrations of the additives based on an amount of the mixed solution drained from the plating solution bath 10, an amount of the plating solution supplied from the plating solution supplier 30, and amounts of the additives supplied from the additive supplier 20. While being larger in the error than the concentration values actually measured by the concentration analyzer 50, calculation values of the concentrations of the additives can be calculated by the computing controller 70 frequently and fed back in real-time. Therefore, the calculation values of the concentrations of the additives calculated by the computing controller 70 (hereinafter, also simply "concentration calculation values") can be used as the condition (the first condition) for supplying the plating solution and the additives as explained later.

The drained solution tank 60 holds therein the mixed solution drained from the plating solution bath 10. The drained solution tank 60 can be provided outside the plating apparatus 1. In this case, a drainage pipe that transports the drained solution from the plating solution bath 10 to the drained solution tank 60 is provided between the plating solution bath 10 and the drained solution tank 60.

Figure 3:
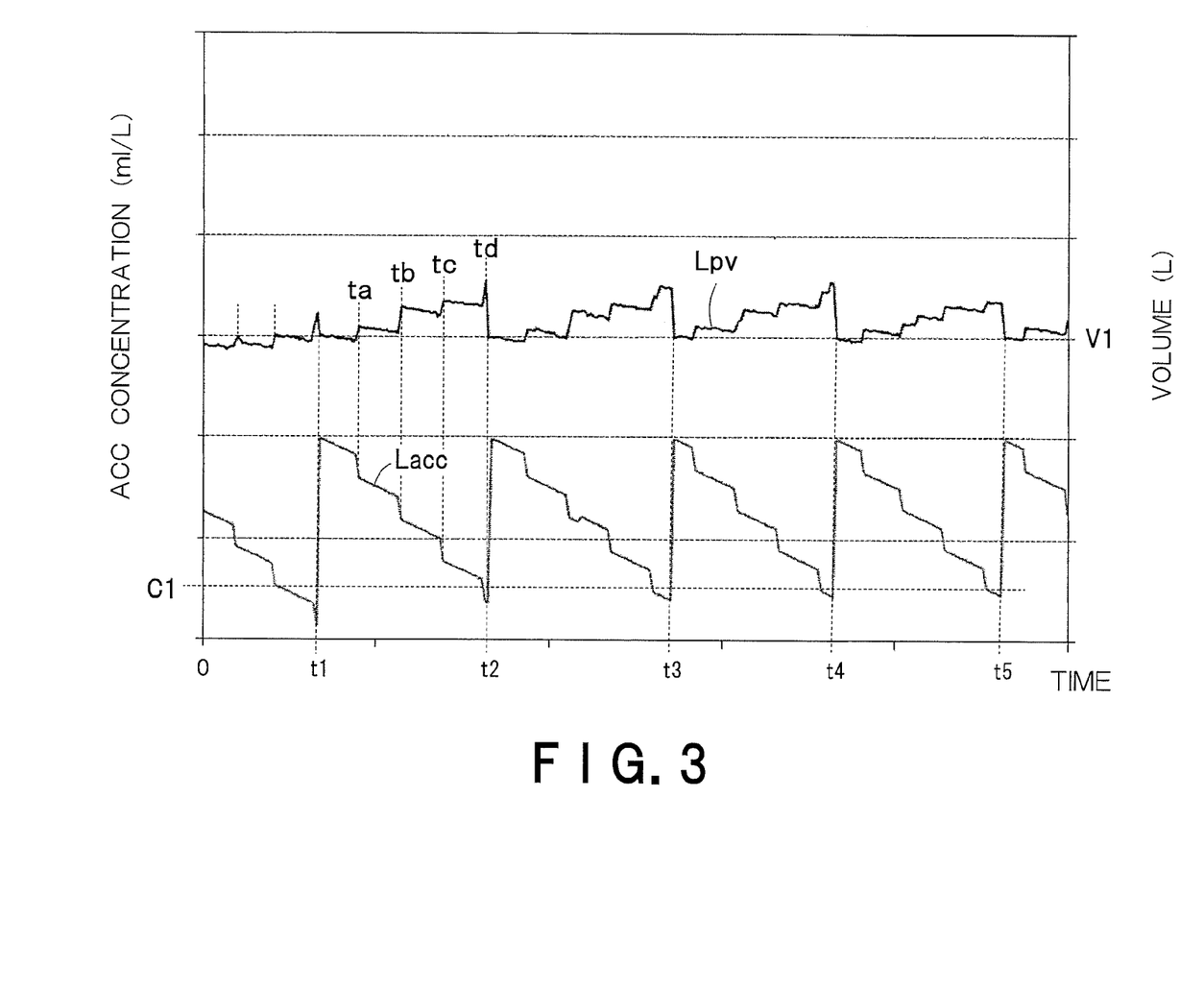
FIG. 3 is a timing chart showing an example of an operation of the plating apparatus 1 according to the present embodiment.

FIG. 3 is a timing chart showing an example of an operation of the plating apparatus 1 according to the present embodiment. Timings of drainage of the mixed solution and addition of the additive are explained with reference to FIG. 3. The vertical axis on the left side in a graph of FIG. 3 represents the concentration of the accelerator and the vertical axis on the right side represents the amount of the mixed solution in the plating solution bath 10. The horizontal axis represents the time. A line Lpv indicates changes in the amount of the mixed solution in the plating solution bath 10. A line Lacc indicates changes in the concentration of the accelerator.

Referring to the line Lpv, the amount of the mixed solution in the plating solution bath 10 periodically increases. For example, during a period between times t1 and t2, the amount of the mixed solution in the plating solution bath 10 increases at times ta, tb, tc, and td. This is because the plating solution supplier 30 supplies (feeds) a predetermined amount (500 milliliters, for example) of the plating solution to the plating solution bath 10 at the times ta, tb, tc, and td. Timings when (intervals at which) the plating solution supplier 30 supplies the plating solution are preset and the computing controller 70 controls the plating solution supplier 30 based on the timings. The plating solution supplier 30 periodically supplies the plating solution to the plating solution bath 10 also in other periods (between times t2 and t5, and the like). Referring to the line Lacc, it can be seen that the concentration of the accelerator decreases with supply of the plating solution at the times ta, tb, tc, and td. Although the amount of the additive does not change, the concentration of the additive decreases due to increase of the amount of the plating solution in the plating solution bath 10.

Referring to the line Lpv again, it can be seen that the amount of the mixed solution in the plating solution bath 10 decreases to a predetermined amount V1 at the times t1, t2, t3, t4, and t5. This is because a part of the mixed solution is drained (bled) from the plating solution bath 10 to the drained solution tank 60 at the times t1, t2, t3, t4, and t5. The mixed solution in the plating solution bath 10 is subjected to the BF process in this manner.

On the other hand, referring to the line Lacc at the times t1 to t5, the concentration of the accelerator increases immediately after the times t1, t2, t3, t4, and t5. This is because the additive supplier 20 supplies the accelerator to the plating solution bath 10 at the times t1, t2, t3, t4, and t5 immediately after a part of the mixed solution is drained to the drained solution tank 60.

Referring to the lines Lpv and Lacc at the times t1 to t5, timings of drainage of the mixed solution are associated with timings of addition of the accelerator and the addition of the accelerator is performed immediately after the drainage of the mixed solution. A condition of performing the drainage of the mixed solution and the addition of the accelerator is explained with reference to FIG. 4.

Figure 4:
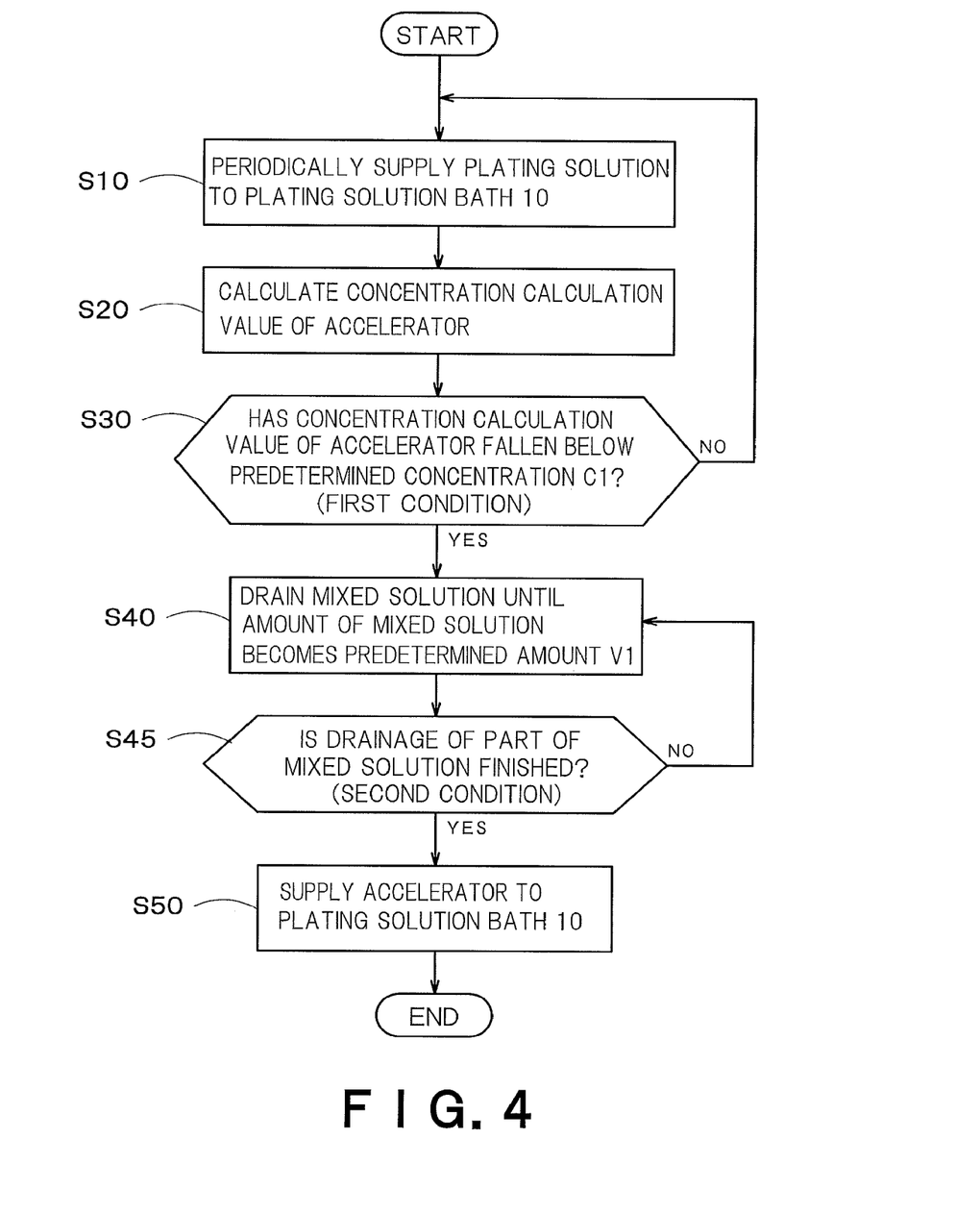
FIG. 4 is a flowchart showing an example of an operation of the plating apparatus 1 according to the present embodiment.

FIG. 4 is a flowchart showing an example of an operation of the plating apparatus 1 according to the present embodiment. First, the plating solution supplier 30 periodically supplies the plating solution to the plating solution bath 10 (Step S10).

Next, the computing controller 70 calculates a calculation value of the concentration of the accelerator based on an amount of the plating solution and an amount of the additive in the mixed solution initially held in the plating solution bath 10, an amount of the mixed solution drained from the plating solution bath 10, an amount of the plating solution supplied from the plating solution supplier 30, an amount of the additive supplied from the additive supplier 20, and the like (Step S20). Because the plating solution is supplied periodically to the plating solution bath 10 as described above, the concentration calculation value of the accelerator gradually decreases as indicated by the line Lacc between the times t1 and t2 in FIG. 3. The computing controller 70 determines whether the concentration calculation value of the accelerator has fallen below a predetermined concentration C1 (whether the first condition is satisfied) (Step S30). The concentration calculation value is different from an actually measured value (a concentration measurement value) and is a calculational concentration. Therefore, the concentration calculation value includes a larger error than the concentration measurement value. However, the concentration calculation value can be calculated by the computing controller 70 frequently in a short time and is used as the first condition in the present embodiment.

When the concentration calculation value of the accelerator is lower than the predetermined concentration C1 (when the first condition is satisfied: YES at Step S30), the plating solution bath 10 drains the mixed solution until the amount (the volume) of the mixed solution becomes the predetermined amount V1 (Step S40).

On the other hand, when the concentration calculation value of the accelerator is equal to or higher than the predetermined concentration C1 (when the first condition is not satisfied: NO at Step S30), the plating solution bath 10 does not drain the mixed solution. In this case, the process returns to Step S10.

After the drainage of the mixed solution is finished (YES at Step S45), the additive supplier 20 supplies the accelerator (Step S50). That is, the computing controller 70 controls the additive supplier 20 to supply the accelerator to the plating solution bath 10 using the fact that the concentration calculation value of the accelerator has fallen below the predetermined concentration C1 (the first condition) and the fact that drainage of a part of the mixed solution is finished (a second condition) as a trigger.

In this manner, when the concentration calculation value of the accelerator falls below the predetermined concentration C1, the additive supplier 20 adds the accelerator immediately after drainage of the mixed solution from the plating solution bath 10. As a result, wasteful drainage of the accelerator in the BF process of the plating solution can be suppressed. When the amount of the mixed solution is equal to or lower than the predetermined amount V1 even if the first condition is satisfied, the plating solution bath 10 does not need to drain the mixed solution. In this case, the computing controller 70 controls the additive supplier 20 to supply the accelerator while drainage of the mixed solution is not performed.

Figure 5:
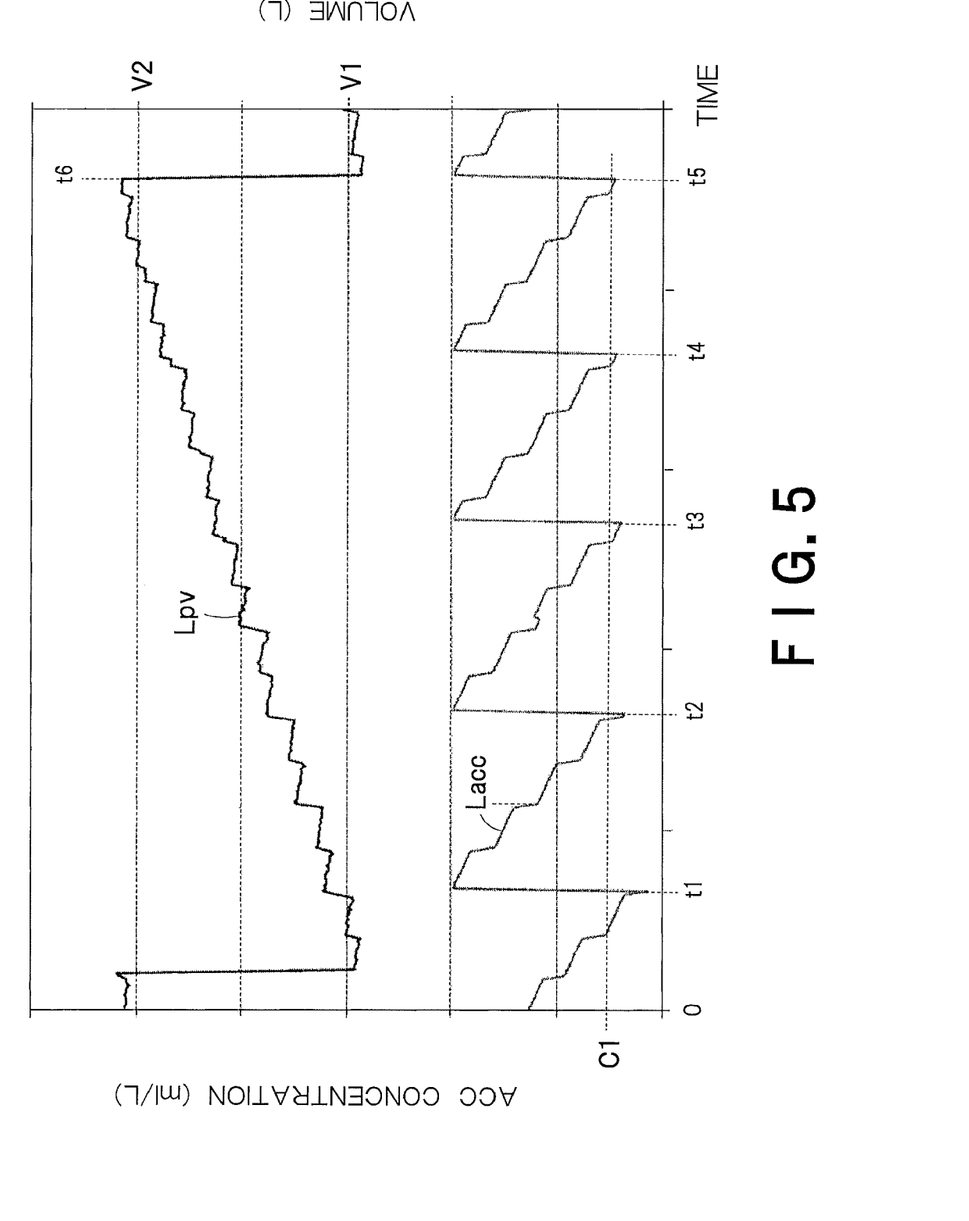
FIG. 5 is a timing chart showing an operation example of the plating apparatus 1 in which drainage of the mixed solution and addition of the accelerator are controlled independently.

If drainage timings of the mixed solution and addition timings of the accelerator are not associated with each other and are controlled independently, the mixed solution may be drained immediately after addition of the accelerator. For example, FIG. 5 is a timing chart showing an operation example of the plating apparatus 1 in which drainage of the mixed solution and addition of the accelerator are controlled independently. Referring to a line Lpv in FIG. 5, the amount of the mixed solution in the plating solution bath 10 periodically increases similarly to the line Lpv in FIG. 3. When the amount of the mixed solution in the plating solution bath 10 exceeds an upper limit V2 at a time t6, the plating solution bath 10 drains the mixed solution to decrease the amount of the mixed solution to the predetermined amount V1. That is, when the amount of the mixed solution has reached the upper limit V2, drainage of the mixed solution is performed to drain substantially an increased amount (V2−V1) of the mixed solution regardless of the concentration of the additive. On the other hand, a line Lacc in FIG. 5 is similar to that in FIG. 3. Therefore, the additive supplier 20 performs supply of the accelerator using the fact that the concentration calculation value of the accelerator has fallen below the predetermined concentration C1 as a trigger regardless of timings of drainage of the mixed solution. In this case, immediately after the additive supplier 20 performs supply of the accelerator at a time t5, the plating solution bath 10 drains the mixed solution at the time t6. Therefore, the accelerator is drained wastefully.

On the other hand, according to the present embodiment, the drainage timings of the mixed solution are associated with the addition timings of the accelerator and addition of the accelerator is performed immediately after drainage of the mixed solution. That is, the plating solution bath 10 drains a part of the mixed solution using the fact that the concentration calculation value of the accelerator has fallen below the predetermined concentration C1 (the first condition) as a trigger. The additive supplier 20 performs supply of the accelerator using the fact that the concentration calculation value of the accelerator has fallen below the predetermined concentration C1 (the first condition) and the fact that drainage of a part of the mixed solution is finished (the second condition) as a trigger. Because the plating solution bath 10 thus drains the mixed solution when the concentration of the accelerator is low, a drainage amount of the accelerator is small during drainage of the mixed solution. Furthermore, the additive supplier 20 adds the accelerator immediately after the mixed solution is drained from the plating solution bath 10. Therefore, the plating apparatus 1 according to the present embodiment can suppress waste of the accelerator and also can increase the concentration of the accelerator. It is preferable that supply of the accelerator be performed at the earliest possible timing after drainage of the mixed solution from the plating solution bath 10. However, the supply timing of the accelerator can be any time after drainage of the mixed solution is finished and before a next supply time of the plating solution (VMS). This enables the supply of the accelerator to be reliably performed with no delay after drainage of the mixed solution is finished.

While the accelerator has been explained in the above embodiment, supply timings of other additives (the suppressor and the leveler) can be similarly associated with the drainage timings of the mixed solution.

Figure 6:
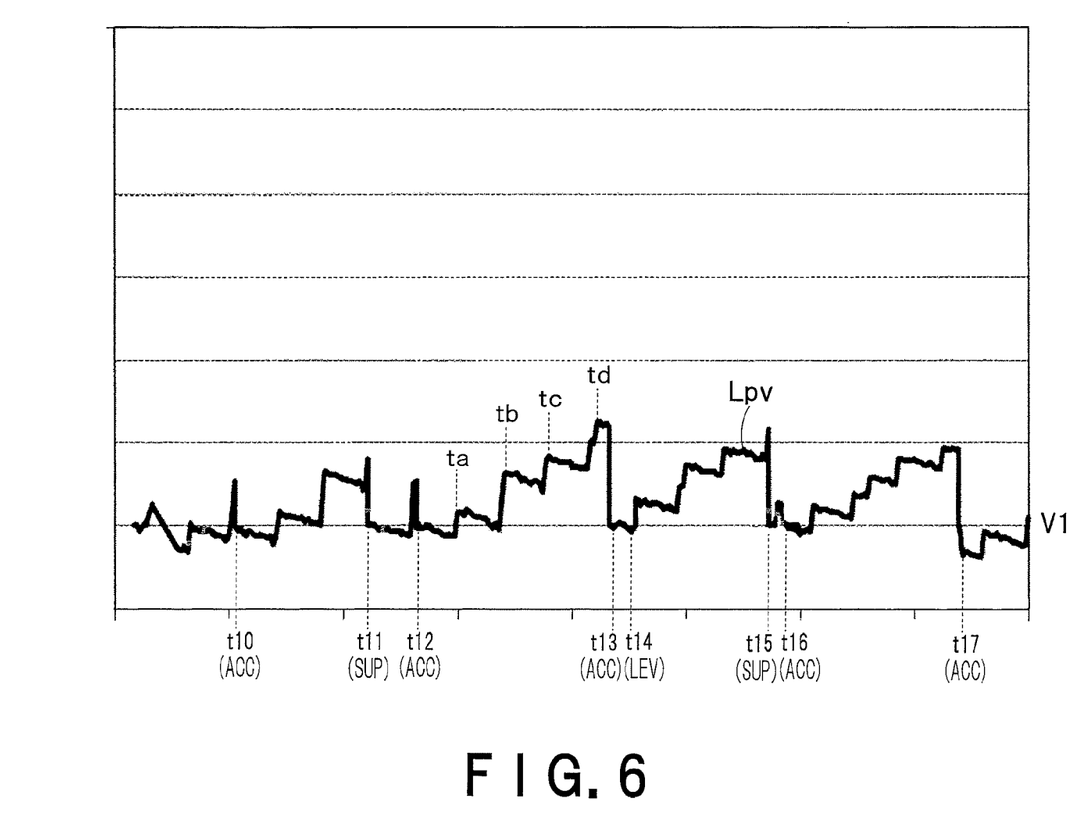
FIG. 6 is a timing chart showing an example of an operation of the plating apparatus 1 including the suppressor SUP and the leveler LEV in addition to the accelerator ACC.

For example, FIG. 6 is a timing chart showing an example of an operation of the plating apparatus 1 including the suppressor SUP and the leveler LEV in addition to the accelerator ACC. The vertical axis represents the amount of the mixed solution in the plating solution bath 10. The horizontal axis represents the time. A line Lpv indicates changes in the amount of the mixed solution in the plating solution bath 10. Illustrations of the concentrations of the additives (ACC, SUP, and LEV) will be omitted.

The amount of the mixed solution in the plating solution bath 10 increases periodically as explained with reference to FIG. 3. For example, the plating solution supplier 30 supplies a predetermined amount (500 milliliters, for example) of the plating solution to the plating solution bath 10 at times ta, tb, tc, and td. The amount of the mixed solution in the plating solution bath 10 accordingly increases.

In FIG. 6, the accelerator ACC is added at times t10, t12, t13, t16, and t17. At that time, the accelerator ACC is added immediately after the mixed solution is drained from the plating solution bath 10 as explained with reference to FIG. 3.

At times t11 and t15, the suppressor SUP is added. At that time, the suppressor SUP also is added immediately after the mixed solution is drained from the plating solution bath 10. The suppressor SUP can be added after the mixed solution is drained using a fact that the concentration calculation value of the suppressor SUP has fallen below a predetermined value as a trigger. Alternatively, the suppressor SUP can be added periodically. For example, a predetermined amount of the suppressor SUP can be added once every several hours.

Further, at a time t14, the leveler LEV is added. At that time, the leveler LEV also is added immediately after the mixed solution is drained from the plating solution bath 10. The leveler LEV also can be added after the mixed solution is drained using a fact that the concentration calculation value of the leveler LEV has fallen below a predetermined value as a trigger. Alternatively, the leveler LEV can be added periodically after the mixed solution is drained. For example, a predetermined amount of the leveler LEV can be added once a day.

Normally, the suppressor SUP and the leveler LEV are added less frequently than the accelerator ACC. Therefore, effects of the present embodiment can be sufficiently achieved even when only the supply timings of the accelerator ACC are associated with the drainage timings of the mixed solution.

In the above embodiment, the drainage of the mixed solution is performed based on the concentration of the additive. However, the drainage of the mixed solution can be performed based on the amount of the mixed solution as well as the concentration of the additive. For example, the plating solution bath 10 can drain the mixed solution until the amount of the mixed solution becomes the predetermined amount V1 when the amount of the mixed solution in the plating solution bath 10 has reached the upper limit V2 as explained with reference to FIG. 5. At that time, when the concentration calculation value is lower than the predetermined concentration C1, the additive supplier 20 can supply the additive to the plating solution bath 10 immediately after the drainage of the mixed solution. In this manner, by setting not only the lower limit of the concentration of the additive but also the upper limit of the amount of the mixed solution, the amount of the mixed solution in the plating solution bath 10 can be suppressed from becoming excessive.

First Modification

In the above embodiment, the concentration of the additive used for the first condition is the concentration calculation value of the additive calculated by the concentration analyzer 50. On the other hand, in a first modification, the concentration measurement value of the additive actually measured by the concentration analyzer 50 is used for the first condition instead of the concentration calculation value of the additive.

The concentration measurement value of the additive is measured periodically (once per day, for example) and is obtained less frequently than the concentration calculation value. However, also when the concentration measurement value of the additive is used instead of the concentration calculation value of the additive, the plating apparatus 1 can achieve effects of the present embodiment to some extent.

For example, the plating solution bath 10 drains the mixed solution until the amount of the mixed solution becomes the predetermined amount V1 using a fact that the concentration measurement value of the accelerator has fallen below the predetermined concentration C1 (the first condition) as a trigger.

Meanwhile, the additive supplier 20 supplies the accelerator using the fact that the concentration measurement value of the accelerator has fallen below the predetermined concentration C1 (the first condition) and the fact that drainage of a part of the mixed solution is finished (the second condition) as a trigger. Accordingly, when the concentration measurement value of the accelerator falls below the predetermined concentration C1, the additive supplier 20 can add the accelerator immediately after the mixed solution is drained from the plating solution bath 10. As a result, in the BF process of the plating solution, wasteful drainage of the accelerator can be suppressed and also the concentration of the accelerator can be increased.

When the concentration measurement value of the additive is equal to or higher than the predetermined concentration C1 at the time of measurement of the concentration by the concentration analyzer 50 (when the first condition is not satisfied), addition of the accelerator does not need to be performed. At that time, the mixed solution can be drained until the amount of the mixed solution becomes the predetermined amount V1 or the mixed solution does not need to be drained. When the amount of the mixed solution is equal to or lower than the predetermined amount V1 when the first condition is satisfied, the additive supplier 20 can supply the accelerator without drainage of the mixed solution (regardless of the second condition).

While being measured less frequently than the concentration calculation value, the concentration measurement value of the additive is more accurate than the concentration calculation value. Therefore, when the concentration measurement value is used for the first condition, the plating solution bath 10 can drain the mixed solution based on an accurate concentration of the additive. Furthermore, the additive supplier 20 can supply the additive based on the accurate concentration of the additive.

Second Modification

In the above embodiment and the first modification, the concentration calculation value or the concentration measurement value of the additive is used for the first condition. However, the first condition can be a fact that a predetermined time has passed from addition of the additive or drainage of the mixed solution. For example, when it is known in advance that the concentration of the additive falls below the predetermined concentration C1 cyclically with a substantially predetermined period, the first condition can be a fact that the predetermined period has passed from the previous addition of the additive. Because drainage of the mixed solution is performed immediately before addition of the additive in the present embodiment, the first condition can be a fact that the predetermined period has passed from the previous drainage of the mixed solution. In this manner, also when drainage of the mixed solution and addition of the additive immediately thereafter are performed periodically, the plating apparatus 1 can achieve effects of the above embodiment.

Third Modification

Figure 7:
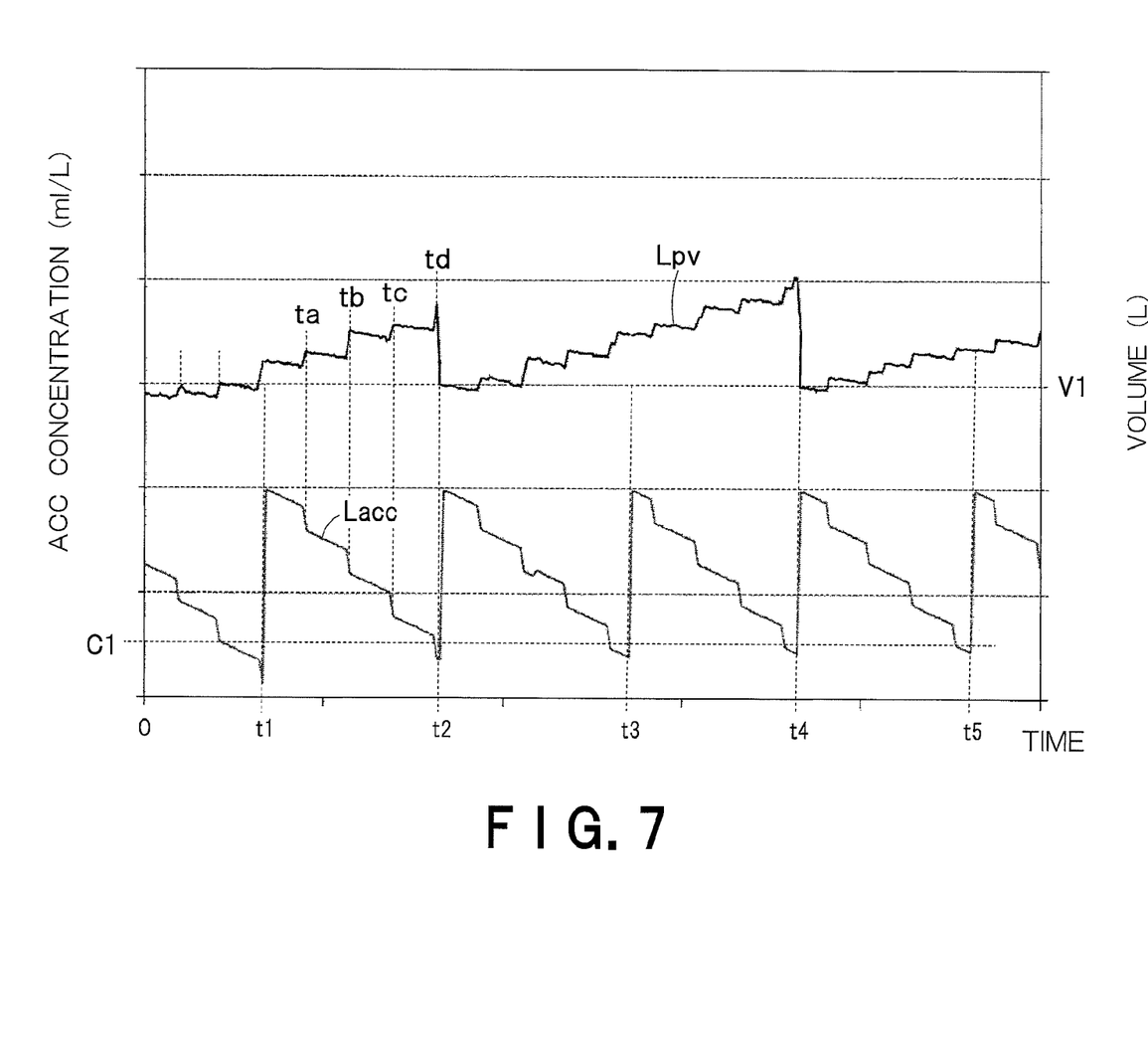
FIG. 7 is a timing chart showing an example of an operation of the plating apparatus 1 according to a third modification.

FIG. 7 is a timing chart showing an example of an operation of the plating apparatus 1 according to a third modification. In the above embodiment, drainage of the mixed solution and addition of the additive are performed each time the first condition is satisfied. However, drainage of the mixed solution does not always need to be performed each time the first condition is satisfied and can be performed when the first condition is satisfied plural times. For example, referring to FIG. 7, the additive supplier 20 supplies the accelerator to the plating solution bath 10 each time the concentration of the accelerator falls below the predetermined concentration C1 (times t1, t2, t3, t4, and t5). On the other hand, the plating solution bath 10 drains a part of the mixed solution when the concentration of the accelerator has fallen below the predetermined concentration C1 twice (the times t2 and t4). In this manner, the plating solution bath 10 drains a part of the mixed solution in the plating solution bath 10 each time the first condition is satisfied plural times. That is, the plating solution bath 10 drains the mixed solution intermittently with respect to the addition of the additive. The additive supplier 20 supplies the additive to the plating solution bath 10 each time the first condition is satisfied. When the plating solution bath 10 drains a part of the mixed solution, the additive supplier 20 supplies the additive when the drainage of a part of the mixed solution is finished.

Also in this example, the addition of the additive at the times t2 and t4 is performed immediately after the drainage of the mixed solution is performed. Therefore, the third modification can also achieve effects identical to those of the present embodiment.

In the third modification, the drainage of the mixed solution is performed once with respect to two times of the addition of the additive. However, the drainage of the mixed solution can be performed once with respect to three or more times of the addition of the additive.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A chemical management method using a semiconductor manufacturing apparatus comprising a container containing a mixed solution that includes a processing solution for plating processing of a substrate and an additive, a first supplier supplying the processing solution to the container, and a second supplier supplying the additive to the container, the method comprising:
    periodically supplying a same amount of the processing solution to the container from the first supplier in a step-wise manner such that a concentration of the additive is periodically decreased in a step-wise manner corresponding to the periodic supply of the same amount of the processing solution to the container;
    calculating a calculation value of a concentration of the additive based on a drainage amount of the mixed solution, a supply amount of the processing solution from the first supplier, and a supply amount of the additive from the second supplier;
    draining a part of the mixed solution from the container until a volume of the mixed solution becomes a predetermined value only after plural occurrences of a first condition and in response to the plural occurrence of the first condition, the first condition being a case that the calculation value of the concentration of the additive has fallen below a predetermined value;
    supplying the additive to the container from the second supplier in response to the first condition being satisfied each time the first condition is satisfied and if draining the part of the mixed solution in response to the plural occurrences of the first condition, the supplying the additive to the container occurs after the draining the part of the mixed solution is finished; and
    supplying deionized water to the container periodically, wherein
    the additive includes at least one of an accelerator, a suppressor, and a leveler, and
    the mixed solution includes a copper sulfate plating solution.

2. A chemical management method using a semiconductor manufacturing apparatus comprising a container containing a mixed solution that includes a processing solution for plating processing of a substrate and an additive, a first supplier supplying the processing solution to the container, and a second supplier supplying the additive to the container, the method comprising:
    periodically supplying a same amount of the processing solution to the container from the first supplier in a step-wise manner such that a concentration of the additive is periodically decreased in a step-wise manner corresponding to the periodic supply of the same amount of the processing solution to the container;
    measuring a concentration of the additive;
    draining a part of the mixed solution from the container until a volume of the mixed solution becomes a predetermined value only after plural occurrences of a first condition and in response to the plural occurrence of the first condition, the first condition being a case that the measured concentration of the additive has fallen below a predetermined value; and supplying the additive to the container from the second supplier in response to the first condition being satisfied each time the first condition is satisfied and if draining the part of the mixed solution in response to the plural occurrences of the first condition, the supplying the additive to the container occurs after the draining the part of the mixed solution is finished; and supplying deionized water to the container periodically, wherein the additive includes at least one of an accelerator, a suppressor, and a leveler, and the mixed solution includes a copper sulfate plating solution.

* * * * *